United States Patent [19]

Haag et al.

[11] Patent Number: 4,931,794
[45] Date of Patent: Jun. 5, 1990

[54] OPTOELECTRONIC KEYBOARD

[75] Inventors: Ernst Haag, Heilbronn; Günter Haag, Stuttgart; Georg Leitner, Nürnberg; Konrad Farnbauer-Schmidt, Lauf, all of Fed. Rep. of Germany

[73] Assignee: Telefunken Electronic GmbH, Heilbronn, Fed. Rep. of Germany

[21] Appl. No.: 139,209

[22] Filed: Dec. 29, 1987

[30] Foreign Application Priority Data

Jan. 14, 1987 [DE] Fed. Rep. of Germany ....... 3700856

[51] Int. Cl.[5] .......................................... H03K 17/969
[52] U.S. Cl. ................................... 341/31; 200/5 A; 250/221; 341/22
[58] Field of Search ................. 341/31, 22; 235/101, 235/145 R; 250/221, 229, 277; 200/5 A; 400/714

[56] References Cited

U.S. PATENT DOCUMENTS

| 3,603,982 | 9/1971 | Patti | 341/31 |
| 4,336,529 | 6/1982 | Buan | 235/101 |
| 4,671,688 | 6/1987 | Brascheurs | 235/145 R |
| 4,701,747 | 10/1987 | Isharwood et al. | 341/31 |

FOREIGN PATENT DOCUMENTS

| 3017309 | 12/1981 | Fed. Rep. of Germany . |
| 3307334 | 9/1984 | Fed. Rep. of Germany . |
| 3307336 | 9/1985 | Fed. Rep. of Germany . |
| 3432100 | 1/1986 | Fed. Rep. of Germany . |
| 3432943 | 3/1986 | Fed. Rep. of Germany . |
| WO80/01116 | 5/1980 | PCT Int'l Appl. . |
| WO86/01954 | 3/1986 | PCT Int'l Appl. . |
| WO85/04295 | 9/1985 | World Int. Prop. O. ............ 341/31 |

OTHER PUBLICATIONS

W. S. Duncan and J. M. Higdon, "Optical Keyboard", IBM Technical Disclosure Bulletin, vol. 23, No. 11, Apr. 1981.

*Primary Examiner*—Alvin Oberley
*Attorney, Agent, or Firm*—Spencer & Frank

[57] ABSTRACT

The invention relates to an optoelectronic keyboard comprising transmitting elements and receiving elements activated in multiplex operation, with the changes in the luminous flux caused by actuation of keys resulting in a signal which defines the actuated key. The invention resides in arranging the transmitting and receiving elements in a main body of the keyboard which comprises a separate cover acting as optical and electromagnetic shielding. The space serving to guide the radiation is preferably separated and shielded from the space accommodating the elements and the electronic evaluating system. Various kinds of multiplex operation can be used to operate the keyboard.

14 Claims, 7 Drawing Sheets

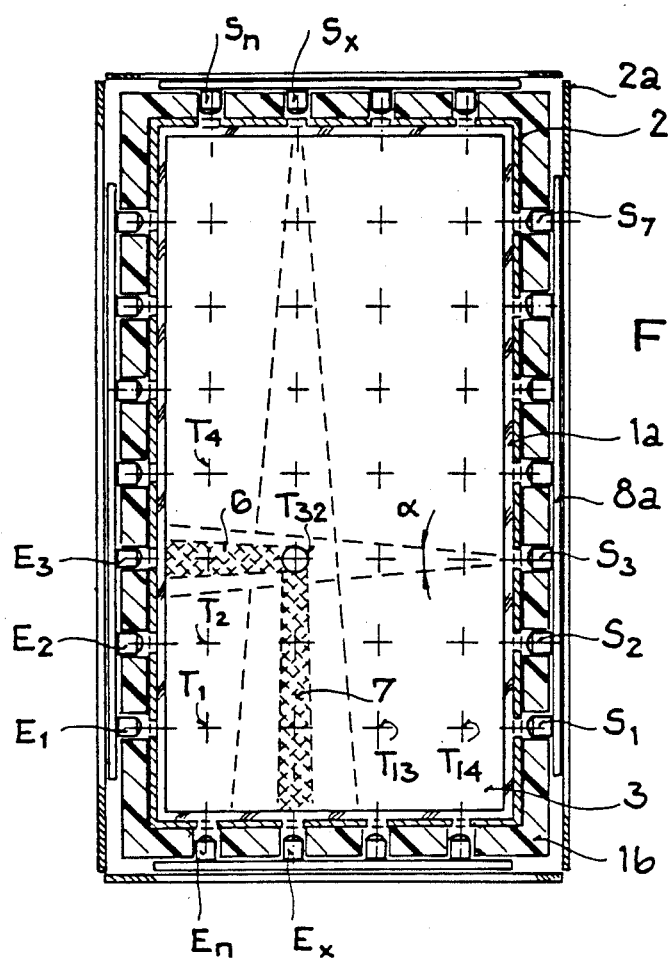
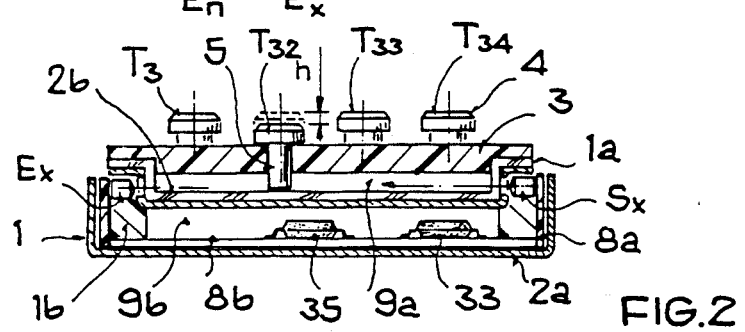
FIG.1
FIG.2

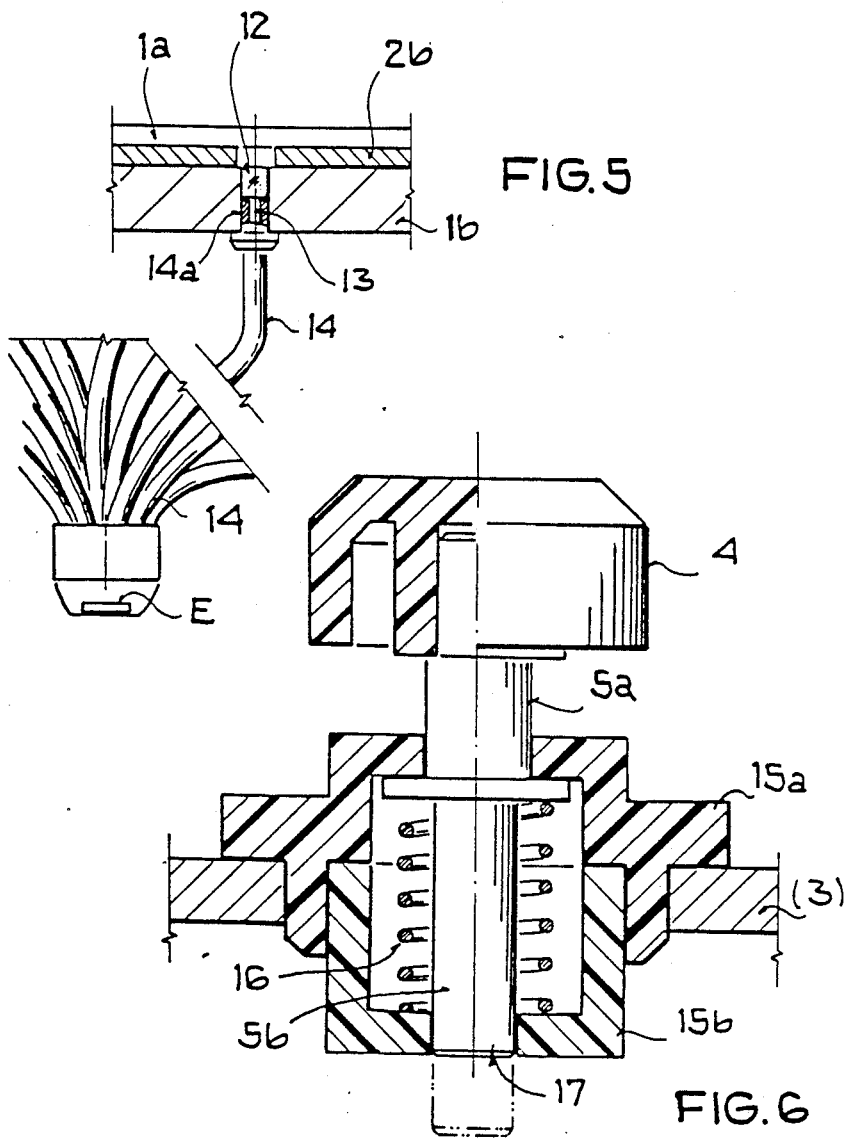

OPTOELECTRONIC KEYBOARD

BACKGROUND OF THE INVENTION

The invention relates to an optoelectronic keyboard which comprises transmitting elements and receiving elements activated in multiplex operation, with the changes in the luminous flux caused by actuation of corresponding mechanical keys resulting in a signal which defines the actuated key. Such a circuit is known from German Offenlegungsschrift Patent Application No. DE-OS 2,953,323.

SUMMARY OF THE INVENTION

The object underlying the invention is to indicate an optoelectronic keyboard which is extremely reliable and is optimally shielded from mechanical, electrical and electromagnetic external influences. This object is achieved by an optoelectronic keyboard comprising transmitting elements and receiving elements with the changes in the luminous flux caused by actuation of corresponding mechanical keys resulting in a signal which defines the actuated key. The transmitting and receiving elements are arranged in a main body of the keyboard, which is provided with a separate cover containing the keys and acting as an optical and electromagnetic shield and contains the keyboard. The keys or key stems exhibit a shape which when the keys are actuated influences travel of the rays between the transmitting and receiving elements. The individual transmitting elements are activated in time or frequency multiplex operation or a special merge operation by an activating circuit, and the signal configurations of various multiplex cycles which are picked up by the receiving elements are compared with one another in a following evaluating circuit and corresponding signal changes lead to of one or several actuated keys, or in that an identification inquiry of the keys is carried out in each multiplex cycle using predetermined threshold values associated with the individual keys.

The essential feature of the inventive optoelectronic keyboard is that the upper section of the housing comprising the keyboard and consisting only of mechanical parts is separated from the section containing the electronic devices and possibly the electronic evaluating system in such a way that neither external mechanical nor electric or electromagnetic influences can affect the keyboard. The mechanical part and the electric part of the keyboard can be separately constructed and then put together to produce a usable unit.

A further fundamental thought underlying the invention is that the number of electronic devices, in particular, the receiving elements, can be reduced to a considerable extent by the multiplex operation and also by the special arrangement of the devices. In individual cases, only one or two detector elements are required. Another advantage of the invention is that the complete electronic evaluating system can be arranged within the main body of the keyboard, and, therefore, the transmitting elements, the receiving elements and the electronic evaluating system can be accommodated and interconnected on suitably arranged boards in the space shielded from the array of keys. In this case, the transmitting and receiving elements are preferably surface mounted devices. A separate area is provided in the flat keyboard for guiding the radiation and is coupled with the transmitting and receiving elements through openings or windows in the shielding.

The keyboard is preferably so designed that when the keys are actuated, the key stems influence the luminous flux in such a way as to produce signal changes which enable identification of one or several actuated keys.

A time or frequency multiplex operation or a special merge operation can be selected for activating the transmitting elements, with the signal configurations of various multiplex cycles which are picked up by the receiving elements being stored and compared with one another in a following evaluating circuit. It is also possible to carry out a key recognition inquiry for each multiplex cycle using predetermined threshold values which are associated with the individual keys.

Further advantageous configurations of the invention are apparent from the subclaims.

BRIEF DESCRIPTION OF THE DRAWINGS

The invention and its advantageous configurations will now be explained in further detail with reference to several embodiments.

FIG. 1 is a plan view and FIG. 2 a sectional view of an embodiment of a keyboard wherein certain receiving elements are shaded off by actuation of a key;

FIG. 5 shows a special embodiment for transmitting and receiving elements made of end pieces of optical fibers;

FIG. 6 shows the design of a key;

DESCRIPTION OF THE PREFERRED EMBODIMENTS

Figure 3:
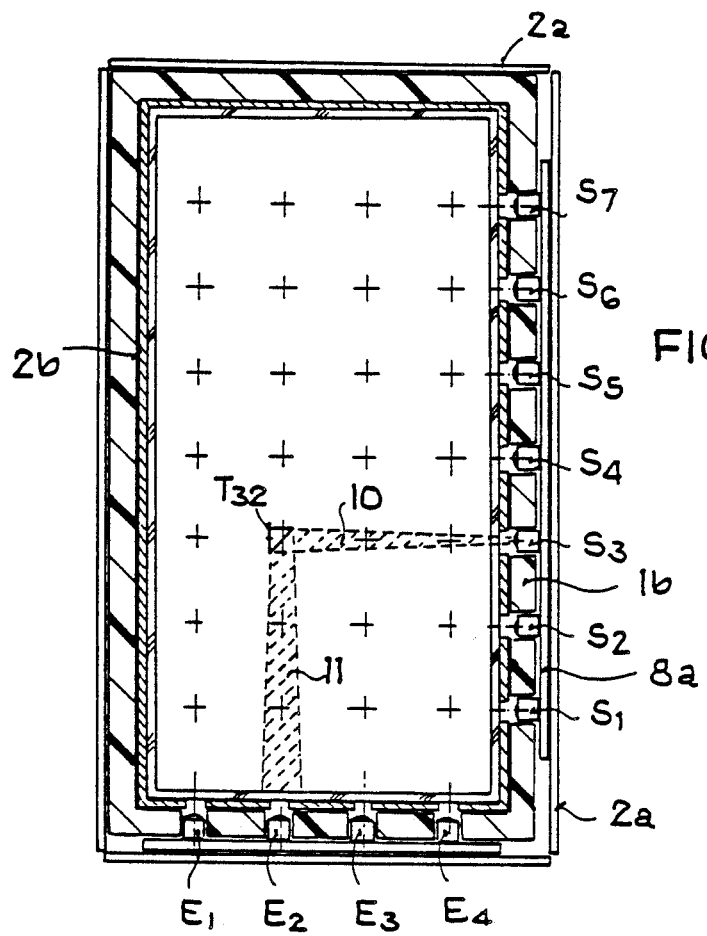
FIG. 3 is a plan view and FIG. 4 a sectional view of another embodiment of a keyboard wherein the light beam emanating from a transmitting element is deflected to a receiving element by actuation of a key.

In the keyboard shown in FIG. 1, a main body 1 contains the transmitting elements S and the receiving elements E and, in the illustrated embodiment, also devices 33 and 35 of the electronic evaluating system. The main body is covered by a cover 3 which serves as key guide for the mechanically actuatable keys. The keys themselves, illustrated here in a simplified form, consist of a key button 4 and a key stem 5. The key stroke is designated by h in FIG. 2.

As is apparent, the transmitting elements S and the receiving elements E are accommodated in part 1b of the main body which encloses the array of keys. This part 1b of the main body consists, for example, of insulating material and contains recesses for accommodating the transmitting elements S and the receiving elements E. In the embodiment, the transmitting elements and receiving elements are arranged in such a way that two edge sections of the rectangular main body 1b comprise transmitting elements S and the two opposite edge sections comprise receiving elements E. Transmitting elements are, for example, light-emitting diodes, whereas photodetectors such as photodiodes or phototransistors can be used as receiving elements.

The space 9a provided for guiding the radiation is delimited, on the one hand, by the cover 3 and, on the other hand, by a tub-shaped part 1a, with the depth of the tub corresponding approximately to the actuation stroke h of the keys. The tub 1a which is transparent with respect to the radiation used and the cover 3 preferably consist of insulating material. Transmitting and receiving elements S and E are disposed in the edge section 1b in such a way that the rays travel between these devices in the space 9a serving to guide the radiation, and the light beam enters and exits through light-transmissive windows in the metallic shielding 2b.

The transmitting and receiving elements S and E are preferably mounted on boards 8a on which the signal lines to the electronic evaluating system also run. The devices of the electronic evaluating system 33 and 35 are preferably disposed beneath the tub 1a. These electronic devices may similarly be arranged on boards 8b which comprise signal lines and interconnection lines and are connected with the associated signal lines on board 8a. In the illustrated embodiment, the boards 8a and 8b extend perpendicularly to each other and form together with the edge sections 1b the main body and the tub 1a a closed space which contains all electronic devices S, E, 33 and 35 and also all signal lines and interconnection lines. This closed space 9b is preferably provided on all sides with a metallic shielding 2a and 2b which completely shields the electronic devices from external influences and electromagnetic radiation. This shielding may consist of metal sheets or metal coatings. However, openings or windows must be provided in this shielding in such a way that travel of the rays between transmitting and receiving elements is not hindered.

As is apparent from FIG. 1, the transmitting elements S emit a bundle of rays with the beam angle $\alpha$. This beam angle is preferably chosen small in order to achieve a good shading-off effect by means of the key stem when a defined key is actuated. In the illustrated embodiment, key $T_{32}$ is actuated and, therefore, the light beam 6 emanating from the transmitting element $S_3$ is shaded off with respect to receiving element $E_3$. The same applies to the light beam 7 emanating from the transmitting element $S_x$ which is shaded off with respect to the receiving element $E_x$. The reduced signal values ascertained at $E_3$ and at $E_x$ clearly indicate that key $T_{32}$ is actuated.

The cover 3 is preferably removable, which makes cleaning the keys T and the entire upper section of the optoelectronic keyboard easy. The electronic part of the keyboard is not affected by this cleaning procedure. The tub 1a protects all the parts lying below it against dampness, liquids or mechanical damage. The individual transmitting elements S and the receiving elements E are activated and inquired in multiplex operation by an activating circuit, not described in further detail, via signal lines. Both time multiplex operation and frequency multiplex operation are conceivable. Evaluation of the signals received by the receiving elements E can be considerably simplified by connecting the receiving elements in series and combining their signals.

In the keyboard shown in FIGS. 1 and 2, the number of transmitting and receiving elements used is less than the number of actuatable keys. This is an essential criterion for the manufacture of favorably priced keyboards. The embodiment shown in FIGS. 3 and 4 requires even less transmitting and receiving elements.

Figure 4:
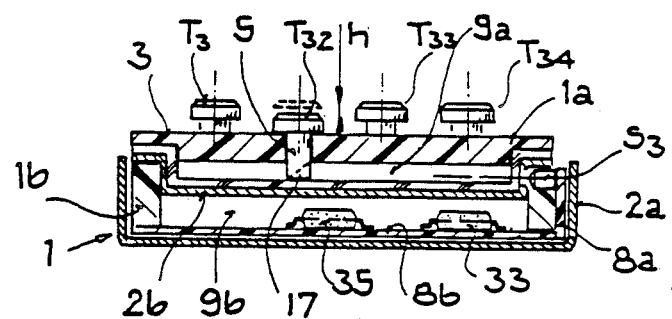

In the arrangement shown in FIGS. 3 and 4, identical reference numerals are chosen for the parts corresponding to the arrangement shown in FIGS. 1 and 2, which makes it unneccessary to explain these components again. In contrast with the arrangement shown in FIGS. 1 and 2, transmitting elements $S_1$–$S_7$ are disposed at only one edge of the main body 1b. Receiving elements $E_1$–$E_4$ are arranged at an edge extending perpendicularly thereto. The part 17 of the key stems influencing travel of the rays is so designed that when the key is actuated, the light beam 10 emanating from a transmitting element $S_3$ 3 is deflected through 90 degrees and thus strikes the receiving element $E_2$ as light beam 11. In this case, the stem end 17 is in the form of a 90 degree corner reflector. Consequently, if, as illustrated in the embodiment, key $T_{32}$ is depressed, the input signal in the receiving element $E_2$ becomes much stronger and, therefore, given an emission time of element $S_3$ defined by the clock time, it can be determined that key $T_{32}$ is actuated. The activating circuit which is not separately illustrated and the associated evaluating circuit are again preferably accommodated in the protected and shielded bottom section 1 of the optoelectronic keyboard, as illustrated in FIG. 4. The individual transmitting elements $S_1$–$S_7$ are activated in succession via associated signal lines and corresponding light pulses are emitted. The various receiving elements $E_1$–$E_4$ transfer the picked-up signals via connected signal lines to the evaluating circuit which, as explained, delivers a signal corresponding to a depressed key or presents a corresponding display.

As explained, electroluminescent diodes are preferably used as transmitting elements and photodiodes or phototransistors as receiving elements. As illustrated in FIG. 5, it is, however, also possible to use fiber optics for the transmitting and receiving elements. A receiving element then consists, for example, of the end piece 13 of an optical fiber held in a sleeve 14a which, in turn, is arranged in a recess 12 of the main body 1b. The optical-fiber cable 14 leads to a receiving element E which is disposed at a suitable location in the optoelectronic keyboard. As indicated in FIG. 5, a number of optical-fiber cables 14 can lead to one receiving element as the signal inquiry of receiving element E is carried out in multiplex operation.

FIG. 6 shows the structure of a single key. The key button 4 is firmly connected to the key stem 5a. This key stem is guided in the region 5b in a movable manner in a bottom key section comprised of two parts 15a and 15b. The stem 5 is pushed to the upper limit by spring 16 without additional application of external force. By actuating the key, the stem 5 is moved down and the bottom end 17 of the stem penetrates the space provided for guiding the rays and influences travel of the rays there. In the embodiment in FIG. 6, the stem end 17 is of cylindrical configuration, which makes it suitable for interrupting an existing beam of light. Deflection of the light can be carried out by constructing this part as a corner reflector.

Figure 7:
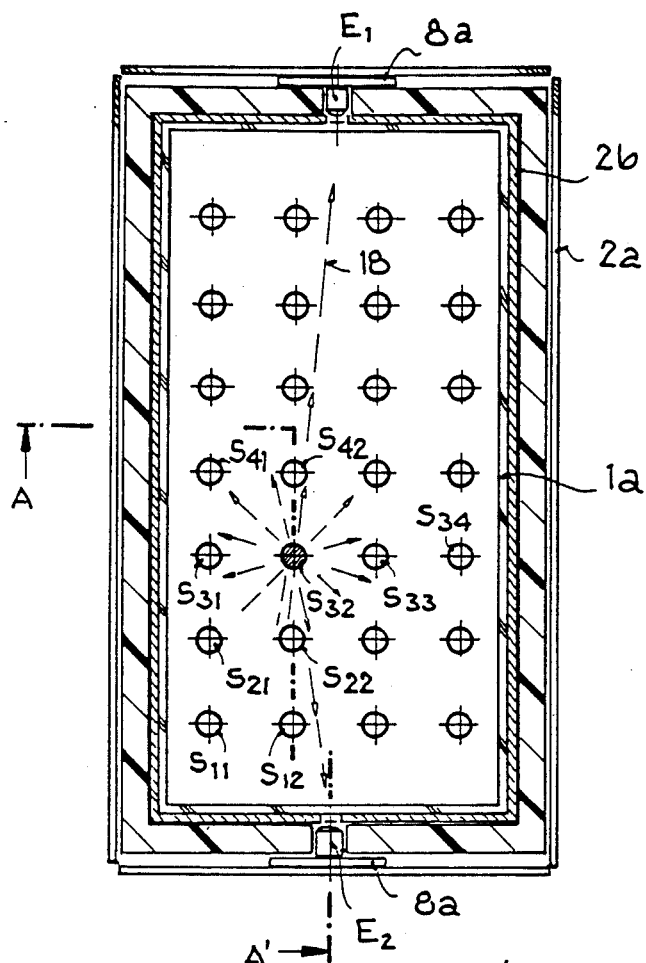
FIG. 7 is a plan view and FIG. 8 a sectional view of a further embodiment of a keyboard wherein a transmitting element is associated with each key and the absorbed light intensity at one or several receiving elements is changed by actuation of a key.
Figure 8:
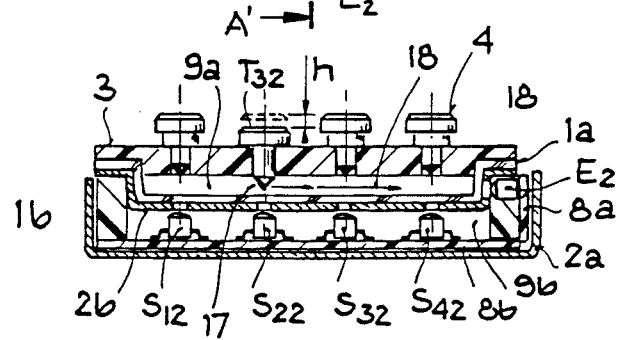

In the optoelectronic keyboard shown in FIGS. 7 and 8, a transmitting element S is arranged beneath each key. The transmitting elements are disposed, for example, as surface mounted devices on the carrier board 8b on which the electronic evaluating system may also be arranged at a suitable point. The divergent light beam emanating from the transmitting elements S enters the space 9a provided for guiding the light through windows or openings in the shielding 2b and the bottom of the tub 1a. If the keys are not actuated, the entering light is substantially absorbed by the cover 3. If, for example, as illustrated in FIG. 7, key $T_{32}$ is depressed, the light beam emanating from the transmitting element $S_{32}$ undergoes reflection at the conical stem end 17 with the result that clearly increased and hence recognizable ray components 18 reach the receiving elements $E_1$ and $E_2$. In the embodiment, two receiving elements $E_1$ and $E_2$ are arranged in opposite side sections in the main body 1b. One receiving element is, of course, also sufficient or further receiving elements can also be used if a corresponding redundancy is desired in the signal recognition. Complete shielding of the part containing the electronic devices and the evaluating circuit is also possible with the arrangement shown in FIGS. 7 and 8 and, therefore, the keyboard can be used even under extreme environmental conditions or in liquids. The cover 3 containing the array of keys is preferably removable from the main body 1, which enables separation of the array of mechanical keys and the electronic section without affecting the electronic devices. In this way, the optoelectronic keyboard can be easily cleaned or damaged keys T replaced.

In time multiplex operation, the keyboard shown in FIGS. 7 and 8 is activated in such a way that the individual transmitting elements are successively excited. When a key is depressed, a signal increase is then ascertained within the associated time via the receiving elements $E_1$ and $E_2$. This detection procedure is always unambiguous even if several keys are simultaneously pressed. If, as illustrated in FIG. 7, there are two receiving elements, the input signals can be fed to the evaluating circuit in the added form. When the key is depressed, the light component 18 predetermined by the scattered light is raised above a defined threshold.

Figure 9:
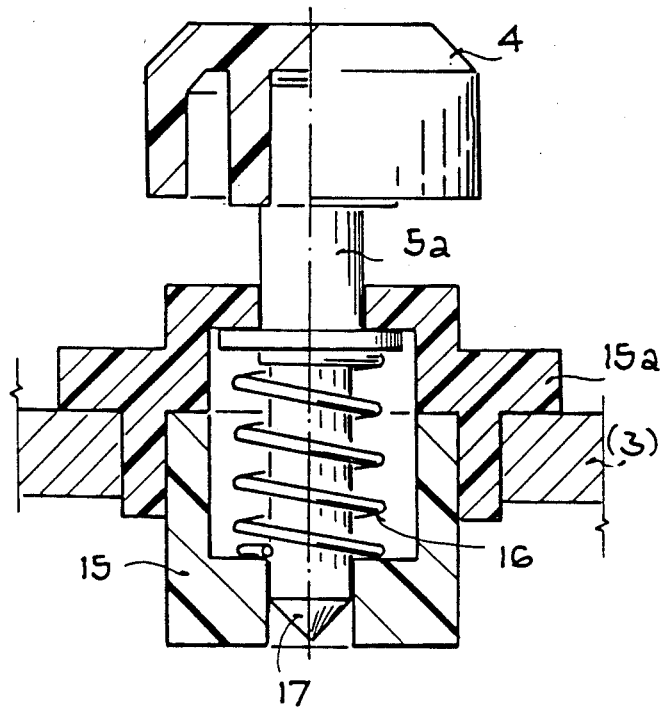
FIG. 9 shows the design of a key which is suited for a keyboard as shown in FIGS. 7 and 8.

In FIG. 9, a single key is again illustrated. It differs from the single key shown in FIG. 6 in that the stem end 17 influencing travel of the rays is of conical configuration. The incident light is radially symmetrically deflected by this cone, as indicated in FIG. 7. A different shape can, however, also be chosen for the stem end 17 and, in particular, the aim is to so deflect the incident light that bundling occurs and the deflected light beam runs parallel to the cover 3 (FIG. 8).

Figure 10:
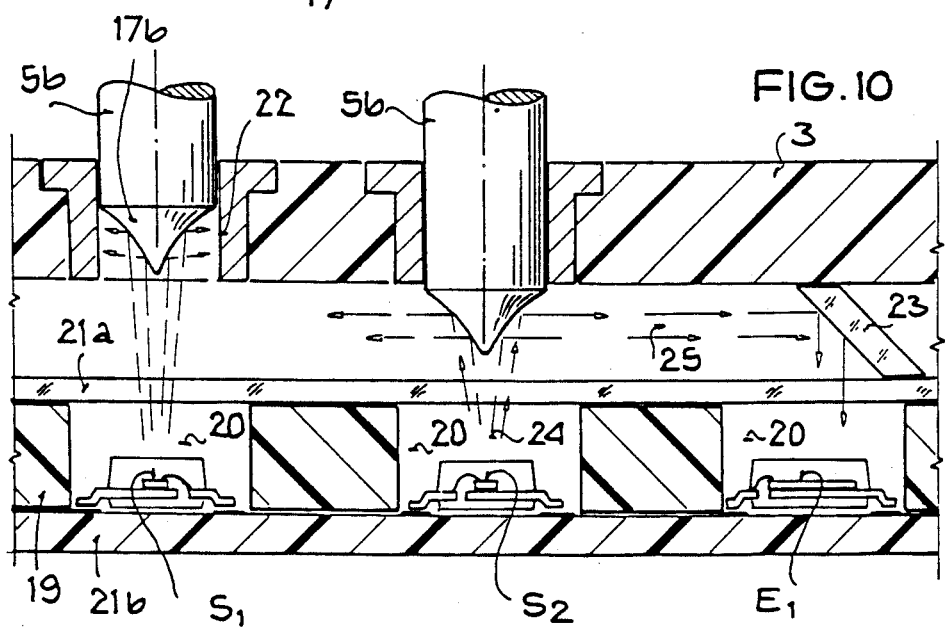
FIG. 10 is a sectional illustration of part of a keyboard wherein the transmitting and receiving elements are surface mounted devices.

FIG. 10 shows a section of an optoelectronic keyboard which is a modification of the assembly shown in FIGS. 7 and 8. The transmitting elements S are disposed in a laminate which first comprises a carrier foil 21b which simultaneously serves to guide the signal lines and on which the electronic evaluating system can also be arranged. The transmitting elements are, for example, surface mounted devices, as is the receiving element. An intermediate foil 19 comprising recesses 20 for accommodating the transmitting and receiving elements is disposed on this carrier foil 21b. Finally, this arrangement comprising base foil and intermediate foil is covered with a foil 21a which protects the electronic devices against external influences. In accordance with FIGS. 7 and 8, the foil 21a may also have a metal coating to provide additional electromagnetic shielding. Of the keys, only the bottom parts 5b of the key stems are illustrated. The bottom end 17 influencing travel of the rays is of conical configuration and the surface line of the cone has a curved shape by means of which the incident divergent light 24 is deflected into a light bundle 25 extending parallel to cover 3 when the key is depressed. When the key is not pressed, the divergent bundle of rays emanating from the associated transmitting element is absorbed by the surroundings 22 of the key stem.

The bundle of rays 25 deflected at a depressed key strikes a mirror 23 at the outer edge of the keyboard which deflects the light beam downwardly again and, therefore, the deflected beam strikes the receiving element $E_1$ through the radiation-transmissive cover 21a and generates a signal there which can be further processed in the following evaluating circuit.

Figure 11:
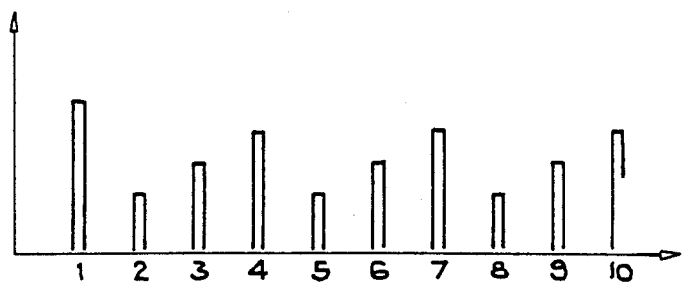
FIGS. 11 and 12 show characteristic signal configurations with depressed and unpressed keys.
Figure 12:
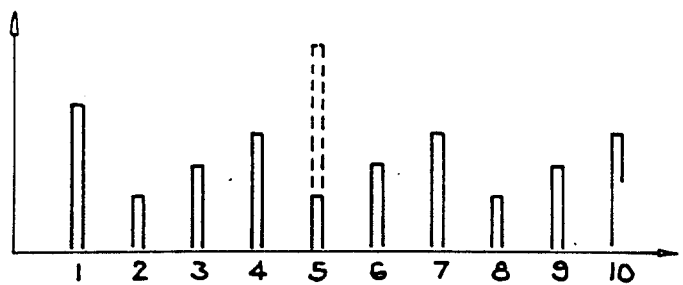

FIG. 11 shows a possible signal configuration measured at the input of the receiving elements E when keys 1-10 are not pressed. In a first cycle, these values can be determined and stored within a multiplex operation. The detected signals are then compared with corresponding signal values of the transmitting elements in a second or later multiplex cycle. Such a second multiplex cycle is illustrated in FIG. 12. As is apparent, the receiving signal has only changed in the case of activation of transmitting element 5, in the manner indicated by dashed lines. This signal increase is triggered by the actuated associated key. Since the signal increase is clear, definite identification of the key state is possible.

Figure 13:
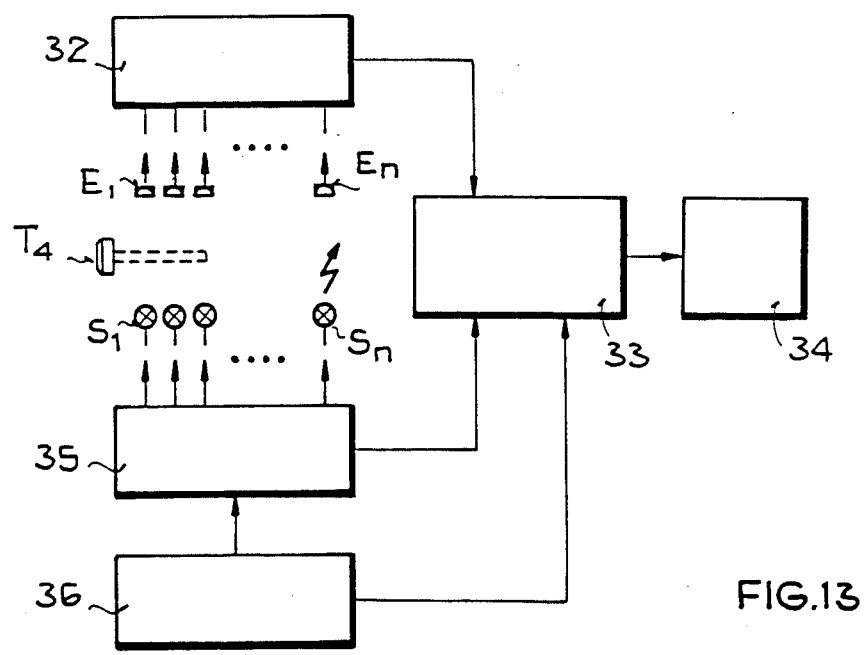
FIG. 13 shows the basic design of the evaluating circuit and the activating circuit for the optoelectronic keyboard.

FIG. 13 shows a possible basic design of the evaluating circuit and the activating circuit for the optoelectronic keyboard. The individual transmitting elements $S_1$–$S_n$ are activated in multiplex operation by the activating circuit 35 by means of the pulses of the clock generator 36. The signals of the receiving elements $E_1$–$E_n$ are fed via signal lines to the signal processing device 32 which serves to suitably process the individual analog signals, for example, to generate a composite signal and possibly filter it. In most cases, subsequent digitization of the received signal is expedient. The output of the signal processing device 32 is connected to the evaluating device 33 which is activated by the clock generator 36. In time multiplex operation, the individual transmitting elements $S_1$–$S_n$ are successively activated and the associated signals picked up via the receiving elements $E_1$–$E_n$, digitized, stored in the evaluating device 33 and the stored signal values are compared with corresponding signal values after one or several further multiplex cycles. If, for instance, actuation of a key T4 results in a characteristic signal change which is not due to mere optical noise, this change is associated with the corresponding key and reported via the device 34.

The electronic activating and evaluating systems can be realized in a simple manner by use of a microcomputer. Since no mechanical contacts are used, the life of the optoelectronic keyboard is determined by the life of the electronic devices and is, therefore, very long.

In frequency multiplex operation, the transmitting elements $S_1$–$S_n$ are activated with different frequencies, in each case. The frequency mixing registered by the receiving elements $E_1$–$E_n$ is examined in the signal processing device 32 to determine the percentage component of the individual frequencies. The change in the intensities of the individual frequencies of the frequency composition enables clear identification of the depressed key in the array of keys. The momentary values of the intensities of the individual frequencies are preferably stored in digital form. The further evaluation is carried out as in time multiplex operation.

It is, of course, also conceivable and possible to combine time multiplex operation with frequency multiplex operation i.e., to use a merge operation.

Figure 14:
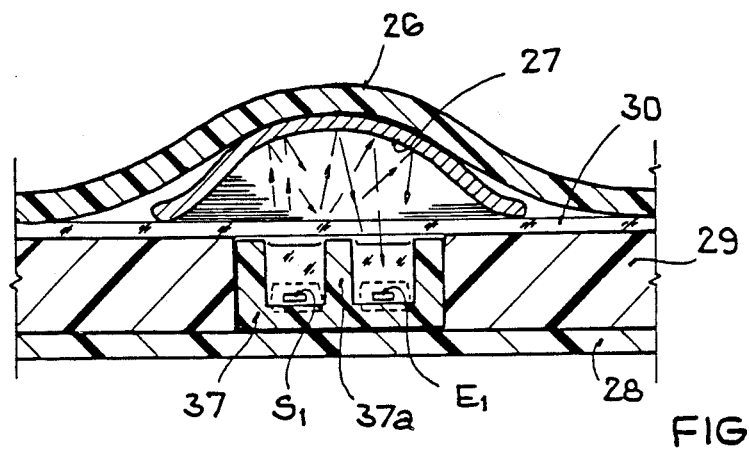
FIG. 14 shows a basic design of the keyboard using a coupling element produced by the SMD technique with a dome-type keyboard.

FIG. 14 shows a section of a single key arrangement in which the key is a dome-type switch. The switching function is performed by pressing the flexible dome 27. All of the domes of an array of keys can be covered by a cover foil 26. Arranged in a laminate beneath the dome-type switch 27 for each switch is a coupling element comprised of a transmitting element $S_1$ and a receiving element $E_1$. The coupling element is preferably a surface mounted device 37. Each of these coupling elements 37 lies on a base foil 28 and is accommodated in a recess in an intermediate foil 29. The entire assembly is covered by a cover foil 30 which is transmissive with respect to the light wavelength. When the dome 27 is not pressed, a certain component of the light emanating from the transmitting element $S_1$ is reflected at the inner surface of the dome 27 and strikes the receiving element $E_1$. When the dome is pressed, this signal which reaches the receiving element $E_1$ is substantially changed, which enables identification of the switched state. The coupling element which is a surface mounted device may be followed by a threshold switch for digitization of the signal received. It may also be integrated with the coupling element itself. The partition 37a of the housing 37 between transmitting and receiving element prevents the light from being directly optically coupled into the receiving element and hence improves the optical signal-to-noise ratio. The inner surface of the dome 27 may be provided with a mirror coating but this is not absolutely essential.

Figure 15:
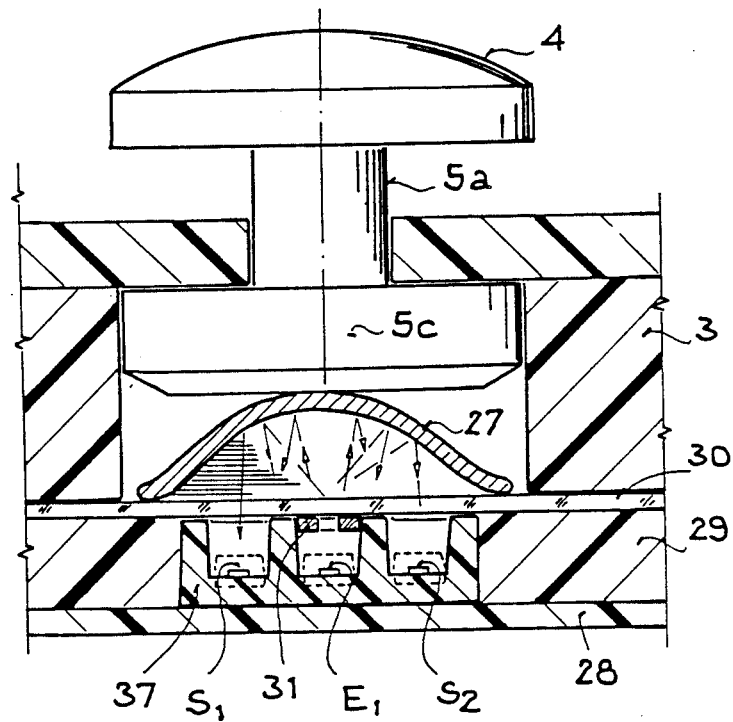
FIG. 15 shows a further variant of a keyboard with dome-type switches.

In contrast with the arrangement shown in FIG. 14, a coupling element is used in the arrangement shown in FIG. 15 which is comprised of two transmitting elements $S_1$ and $S_2$ between which a receiving element $E_1$ is arranged. Again, the complete coupling element is preferably a surface mounted device. When the key is pressed, light can be prevented from reaching the receiving element $E_1$ by a separately designed diaphram 31 over the receiving element. Light only reaches the receiving element $E_1$ when the dome is not pressed. As illustrated in the Figure, the dome-type switch 27 can also be actuated by means of a key comprised of a key button 4 and a key stem 5a, in which case, the broader bottom part 5c of the key stem rests on the dome-type switch 27 and depresses it when the key button 4 is actuated.

It should be noted that it is possible to use any suitable electromagnetic radiation of usable wavelength for the electrooptical coupling. Therefore, transmitting elements which emit visible or invisible light can be used for the optoelectronic keyboard. In particular, infrared devices and heat-sensitive sensors are well suited for an optoelectronic keyboard.

What is claimed is:

1. An optoelectronic keyboard, comprising:
   a plurality of transmitting elements for transmitting a luminous flux,
   a plurality of receiving elements for receiving said flux
   an activation circuit for activation of the individual transmitting elements in one of time or frequency multiplex operation or a special merged operation,
   an evaluation circuit for processing the signal path of different multiplex cycles received by said receiving elements, said evaluation circuit including predetermined threshold values and means for adding consecutive multiplex cycles to determine signal changes,
   a main body in which said transmitting and receiving elements are arranged, said main body including a cover and having a first space for flux flow between said elements and a second space for housing said evaluation circuit and said activation circuit, said first space for flux flow in the main body being separated and shielded from the second space containing the activation and evaluation circuits,
   a plurality of mechanical keys guidably arranged in said cover and having key stems shaped for altering flux flow between said transmitting and receiving elements and for converting diverging bundles of rays from said transmitting elements into essentially parallel bundles of rays which extend essentially parallel to said cover, with the changes in the luminous flux caused by actuation of one of said keys resulting in a signal which defines the actuated key, and
   shielding for said main body that has the effect of an optical and electromagnetic shield and including shielding means comprising one of a metal coating and a metal plate which encloses the entire space containing the evaluation circuit and which is provided with openings for entering and exiting light.

2. Optoelectronic keyboard according to claim 1 wherein the space in the main body containing the electronic evaluating system comprises circuit boards for accommodating the electronic evaluating system and has further circuit boards for accommodating the transmitting and receiving elements.

3. Optoelectronic keyboard according to claim 1, wherein each of said transmitting elements is arranged in a recess beneath a respective one of said keys, in that the bottom end of the stem and the surroundings of the stem of each key are so designed that the radiation emitted by the associated transmitting element is substantially absorbed when the key is not actuated, whereas the radiation emitted from the transmitting element is deflected parallel to the cover when the key is depressed.

4. Optoelectronic keyboard according to claim 1 wherein there is arranged in the path of the light beam deflected at key stems, at the outer edge of the keyboard, a reflector by means of which the light beam is deflected onto one or several receiving elements arranged in the main body.

5. Optoelectronic keyboard according to claim 1, wherein the transmitting and receiving elements are arranged in a foil laminate, with the elements being arranged on a base foil and located in the recesses of an intermediate foil with the intermediate foil and its recesses being covered with a transparent cover foil.

6. Optoelectronic keyboard according to claim 1 wherein the transmitting and receiving elements are arranged and electrically connected as surface mounted semiconductor devices on a base carrier.

7. Optoelectronic keyboard according to claim 1, wherein the individual transmitting elements are activated in multiplex operation by an activating circuit by means of the pulses of a clock generator, with the current being supplied via signal lines and the received signals of the receiving elements likewise being transmitted via signal lines to a signal processing device.

8. Optoelectronic keyboard according to claim 7, wherein the signals picked up by the receiving elements are digitized and stored in the signal processing device, and further including means for comparing the stored signal values after one or several multiplex cycles, with the change in state of the associated key being ascertained in the event of a characteristic change in the stored signal valves.

9. Optoelectronic keyboard according to claim 7, wherein the transmitting elements are activated in frequency multiplex operation with different frequencies and the frequency mixings registered by the receiving elements are examined in the signal processing device to determine the components of the individual frequencies, with changes in the intensity of individual frequencies of the frequency composition being indicative of a change in state of the key corresponding to the transmitting element corresponding to the individual frequency.

10. Optoelectronic keyboard according to claim 9, wherein the signal components of individual frequencies are digitized and stored.

11. Optoelectronic keyboard according to claim 1, wherein said transmitting and receiving elements include luminescent diodes.

12. Optoelectronic keyboard according to claim 1, wherein said transmitting and receiving elements include radiation sensitive semiconductor detectors.

13. Optoelectronic keyboard according to claim 1, wherein said transmitting and receiving elements include heat sensitive sensors.

14. Optoelectronic key board according to claim 1, wherein the transmitting and receiving elements are comprised of the end points of light conducting cables connected to external activation and evaluation electronics.

* * * * *